(12) United States Patent
Lin

(10) Patent No.: US 8,225,846 B2
(45) Date of Patent: Jul. 24, 2012

(54) RADIATING FIN ASSEMBLY AND THERMAL MODULE FORMED THEREFROM

(75) Inventor: Sheng-Huang Lin, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 465 days.

(21) Appl. No.: 12/321,001

(22) Filed: Jan. 14, 2009

(65) Prior Publication Data

US 2010/0124020 A1     May 20, 2010

(30) Foreign Application Priority Data

Nov. 18, 2008 (TW) ............................. 97220653 U

(51) Int. Cl.
*F28F 7/00* (2006.01)

(52) U.S. Cl. .................. 165/80.3; 165/104.33; 165/182; 361/697

(58) Field of Classification Search ............. 165/104.33, 165/104.21, 80.3, 185, 151, 182; 361/699, 361/700, 697
See application file for complete search history.

(56) References Cited

U.S. PATENT DOCUMENTS

| | | | | |
|---|---|---|---|---|
| 4,408,661 A * | 10/1983 | Eastman et al. | ............. | 165/164 |
| 4,777,560 A * | 10/1988 | Herrell et al. | ................. | 361/694 |
| 5,558,155 A | 9/1996 | Ito | | |
| 6,449,160 B1 * | 9/2002 | Tsai | ............................ | 361/709 |
| 6,575,229 B1 * | 6/2003 | Taban | ......................... | 165/80.3 |
| 6,944,024 B1 * | 9/2005 | Devine, III | ..................... | 361/704 |
| 7,243,708 B2 * | 7/2007 | Lee et al. | ................. | 165/104.33 |
| 7,284,597 B2 * | 10/2007 | Tang | ............................. | 165/80.3 |
| 7,660,123 B1 * | 2/2010 | Lin et al. | ........................ | 361/710 |
| D626,520 S * | 11/2010 | Chen et al. | .................... | D13/179 |
| 2005/0284608 A1 * | 12/2005 | Huang et al. | .................. | 165/80.3 |
| 2005/0286232 A1 * | 12/2005 | Chen et al. | .................... | 361/710 |
| 2007/0006997 A1 * | 1/2007 | Hsieh | ........................ | 165/104.33 |
| 2009/0296411 A1 * | 12/2009 | Chang et al. | .................. | 362/373 |

* cited by examiner

*Primary Examiner* — Henry Yuen
*Assistant Examiner* — Devon Russell

(57) ABSTRACT

A radiating fin assembly includes a plurality of alternately stacked first radiating fins and second radiating fins, such that a V-shaped recession is formed between any two adjacent first and second radiating fins. The V-shaped recessions are defined on at least one of two longitudinal sides of the radiating fin assembly and include a plurality of split spaces, first widened spaces, and second widened spaces. The split spaces are formed at a bottom portion of the V-shaped recessions, and the first and the second widened spaces are formed at two opposite ends of the split spaces. The radiating fin assembly can be associated with at least one heat pipe and a base to form a thermal module. With the V-shaped recessions, the radiating fin assembly and the thermal module can have widened airflow inlets, shortened airflow paths, reduced airflow pressure drop and flowing resistance, and accordingly upgraded heat dissipating efficiency.

18 Claims, 13 Drawing Sheets

US 8,225,846 B2

RADIATING FIN ASSEMBLY AND THERMAL MODULE FORMED THEREFROM

FIELD OF THE INVENTION

The present invention relates to a radiating fin assembly and a thermal module formed therefrom, and more particularly, to a radiating fin assembly and a thermal module formed therefrom capable of reducing cooling airflow pressure drop.

BACKGROUND OF THE INVENTION

With the progress in the technological fields, all kinds of electronic elements have constantly upgraded operating ability, which also brings increased heat produced by the electronic elements during the operation thereof. Therefore, people demand more and more for heat sinks with improved performance. For the purpose of providing enhanced heat dissipating function, most of the conventional heat sinks will adopt a radiating fin assembly consisting of a plurality of sequentially stacked radiating fins. Researches have been constantly conducted to develop improved radiating fins, and a high-performance heat sink has become one of the most important targets in the industrial field. For example, among others, the central processing unit (CPU) of a computer produces the largest part of heat in the computer. The CPU would become slow in running when the heat produced and accumulated in the computer gradually increases. When the heat accumulated in the computer exceeds an allowable limit, the computer is subject to the danger of shutdown or even becoming seriously damaged. Moreover, to solve the problem of electromagnetic radiation, a case is used to enclose all the important computer components and elements therein. Therefore, it is very important to quickly dissipate the heat produced by the CPU and other heat-producing elements in the computer case.

FIG. 1A is a perspective view of a conventional thermal module, and FIG. 1B is a top view of a radiating fin assembly 1 included in the thermal module. As shown, the conventional thermal module includes a radiating fin assembly 1, which is formed by a plurality of sequentially stacked radiating fins 11. Generally, each of the radiating fins 11 is a cut sheet metal material with two opposite ends being bent toward the same side to form two flanges 111. The flanges 111 on a higher radiating fin 11 are pressed against a top face 11a of an adjacent lower radiating fin 11, such that a heat dissipating space 112 is formed between any two adjacent radiating fins 11. A cooling fan 12 is mounted to one longitudinal side of the radiating fin assembly 1 to face toward the heat dissipating spaces 112. When the cooling fan operates, it produces and forces cooling airflows 121 into the heat dissipating spaces 112 to carry heat away from the radiating fin assembly 1. Since the radiating fin assembly 1 is formed from a plurality of closely stacked radiating fins 11, the heat dissipating spaces 112 formed between two adjacent radiating fins 11 are extremely small in height. Meanwhile, the heat dissipating spaces 112 each have a relatively large depth to define a quite long path for the cooling airflows 121. As a result, the cooling airflows flowing through the heat dissipating spaces 112 are subject to increased pressure drop and slowed flowing speed, which have adverse influences on the heat dissipating efficiency of the thermal module.

In brief, the conventional radiating fin assembly and the thermal module formed therefrom have the following disadvantages: (1) providing only very narrow heat dissipating spaces; (2) having poor heat-exchange efficiency; (3) providing only low heat dissipating efficiency; (4) having quiet long cooling airflow paths; and (5) subjecting the cooling airflow to increased pressure drop.

It is therefore tried by the inventor to develop an improved radiating fin assembly and a thermal module formed from such radiating fin assembly to overcome the drawbacks in the conventional radiating fin assembly and the thermal module formed therefrom.

SUMMARY OF THE INVENTION

A primary object of the present invention is to provide a radiating fin assembly capable of reducing cooling airflow pressure drop.

Another object of the present invention is to provide a thermal module formed from a radiating fin assembly capable of reducing cooling airflow pressure drop.

To achieve the above and other objects, the radiating fin assembly according to the present invention includes a plurality of alternately arranged and sequentially stacked first radiating fins and second radiating fins, such that any two adjacent first and second radiating fins together define a sideward-opened substantially V-shaped recession between them. The sideward-opened substantially V-shaped recessions are defined on at least one of two longitudinal sides of the radiating fin assembly, and include a plurality of split spaces, a plurality of first widened spaces, and a plurality of second widened spaces. The split spaces are formed at a bottom portion of the V-shaped recessions, and the first widened spaces and the second widened spaces are formed at two opposite ends of the split spaces.

According to the present invention, the radiating fin assembly thereof can be associated with at least one heat pipe and a base to form a thermal module.

With the V-shaped recessions, the radiating fin assembly and the thermal module of the present invention can have widened airflow inlets, shortened airflow paths, reduced airflow pressure drop and flowing resistance, and upgraded cooling air flowing efficiency, and can therefore provide excellent heat dissipating effect.

In brief, the present invention provides at least the following advantages: (1) having good heat dissipating efficiency; (2) enabling reduced cooling airflow pressure drop; (3) having high heat-exchange efficiency; (4) having simple structure; (5) preventing heat from stagnating around the radiating fin assembly; (6) allowing heat source to quickly diffuse into ambient environment; and (7) enabling upgraded cooling air flowing efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
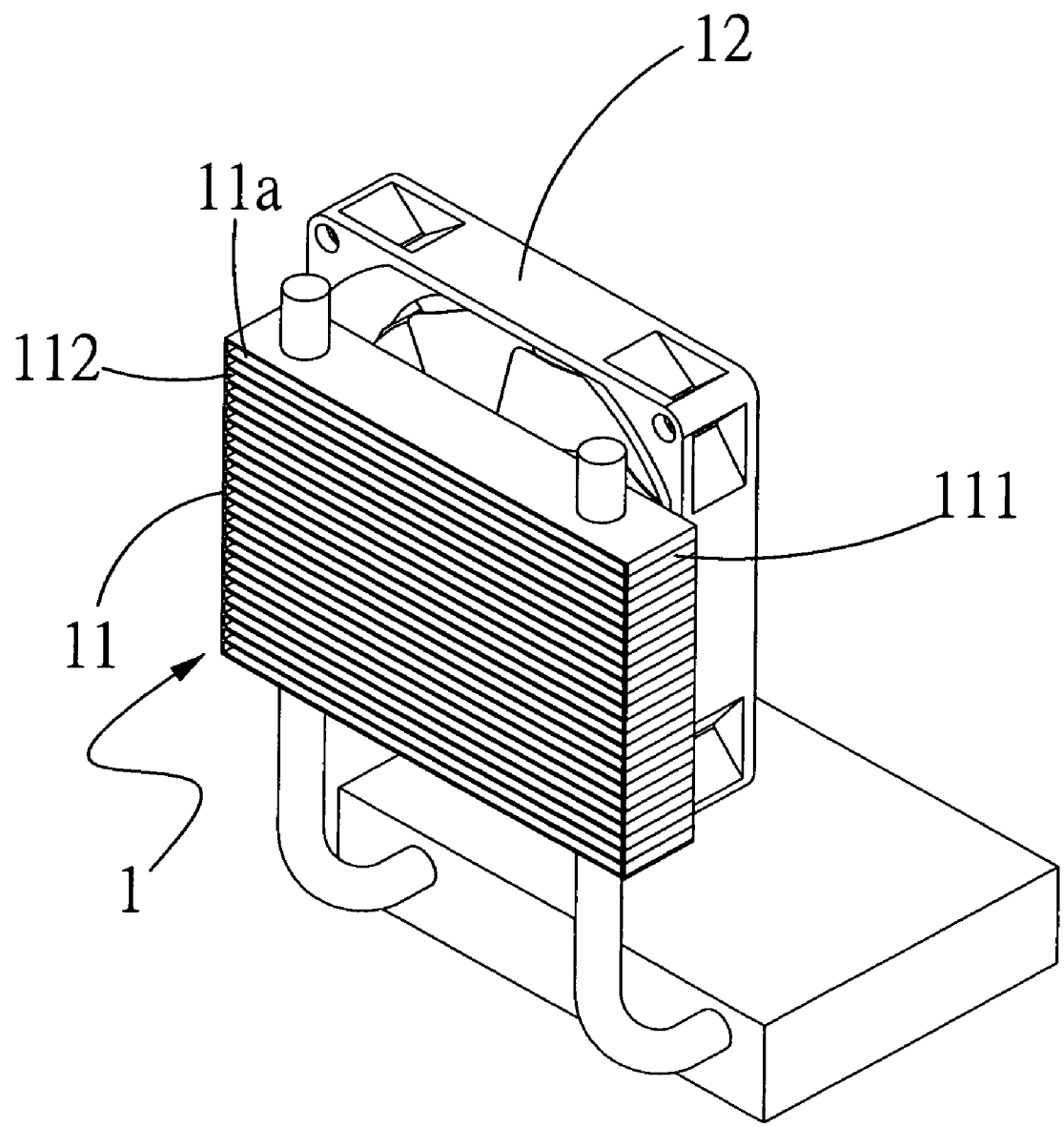
FIG. 1A is a perspective view of a conventional thermal module.
Figure 1B:
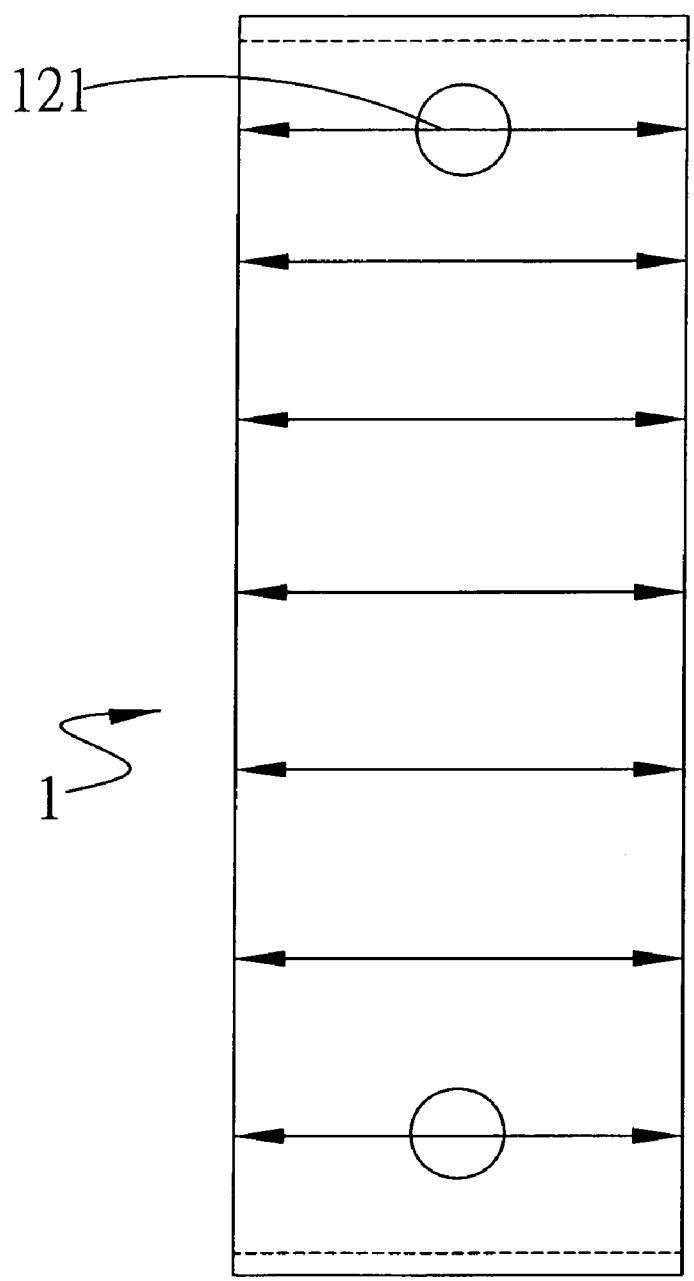
FIG. 1B is a top view of a conventional radiating fin assembly for the thermal module of FIG. 1A.
Figure 2:
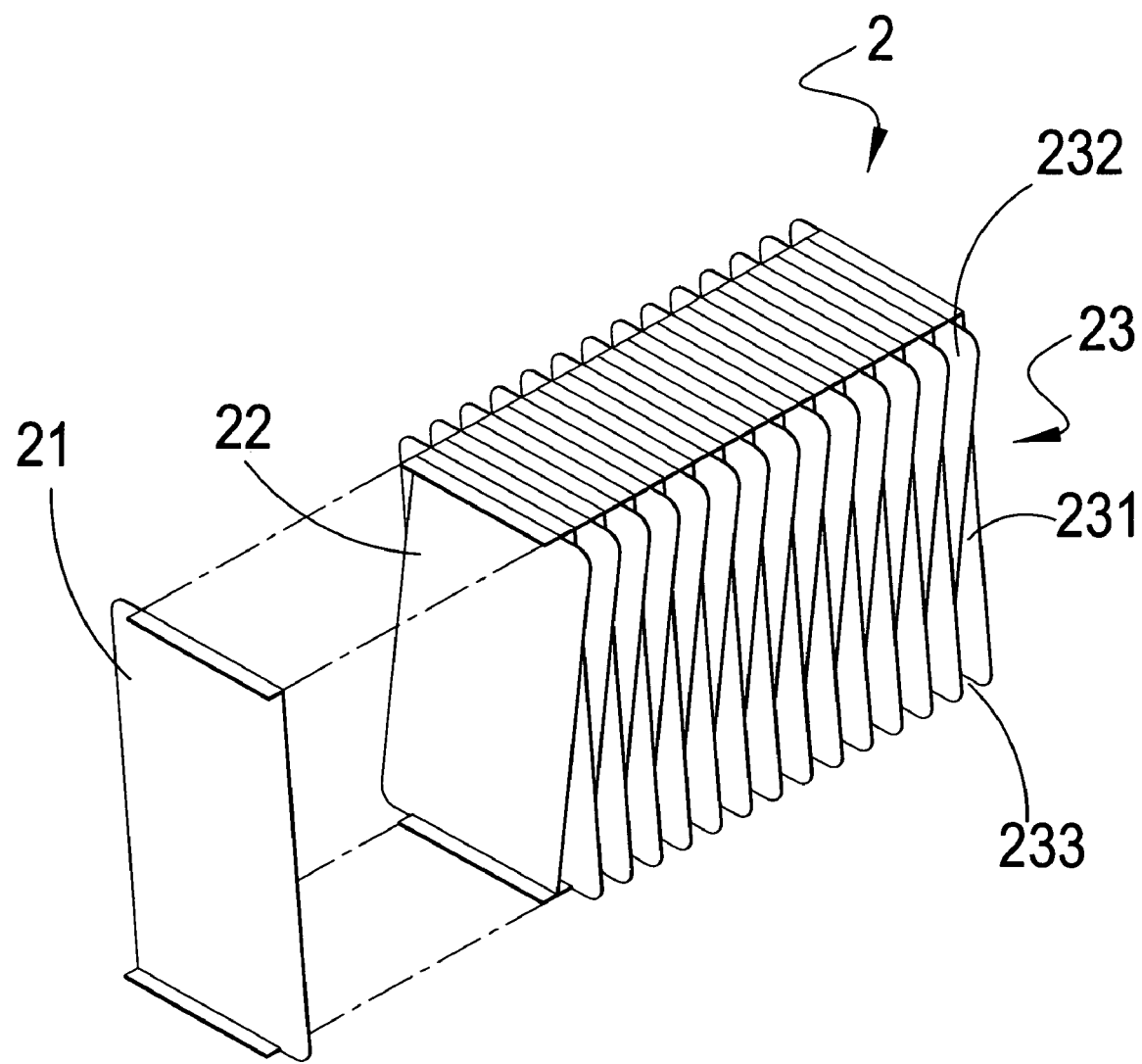
FIG. 2 is a partially exploded perspective view of a radiating fin assembly according to a first preferred embodiment of the present invention.
Figure 3A:
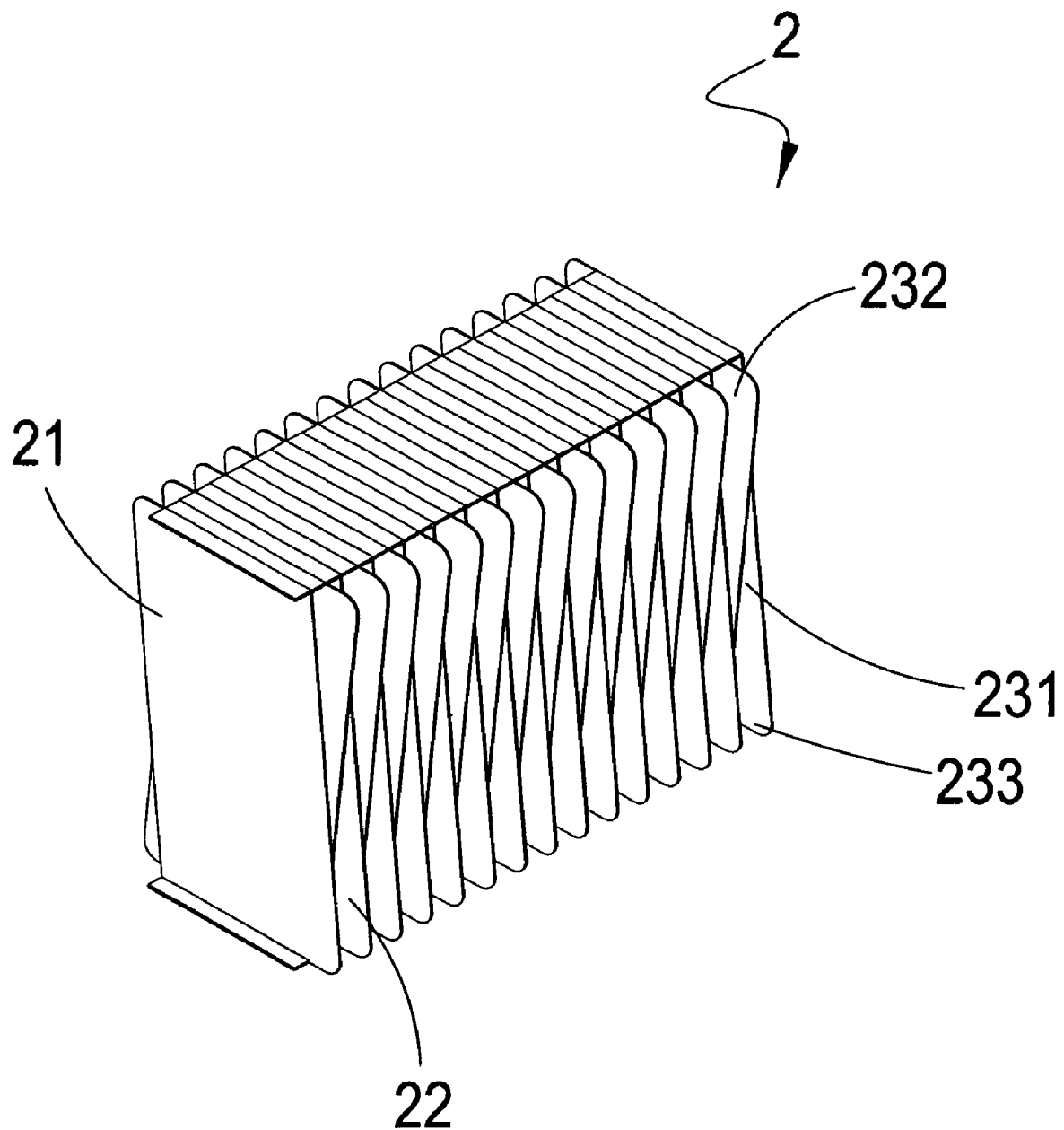
FIG. 3A is an assembled view of FIG. 2.

Please refer to FIGS. 2 and 3A, which are partially exploded and fully assembled perspective views, respectively, of a radiating fin assembly 2 according to a first preferred embodiment of the present invention. As shown, the radiating fin assembly 2 includes a plurality of sequentially stacked first radiating fins 21 and second radiating fins 22. Each of the first radiating fins 21 and an adjacent second radiating fin 22 together define a sideward-opened substantially V-shaped recession 23 between them. The V-shaped recessions 23 are defined on at least one of two longitudinal sides of the radiating fin assembly 2, and include a plurality of split spaces 231, a plurality of first widened spaces 232, and a plurality of second widened spaces 233. The split spaces are formed at a bottom portion of the V-shaped recessions 23, and the first widened spaces 231 and the second widened spaces 233 are formed at two opposite ends of the split spaces 231.

Figure 3B:
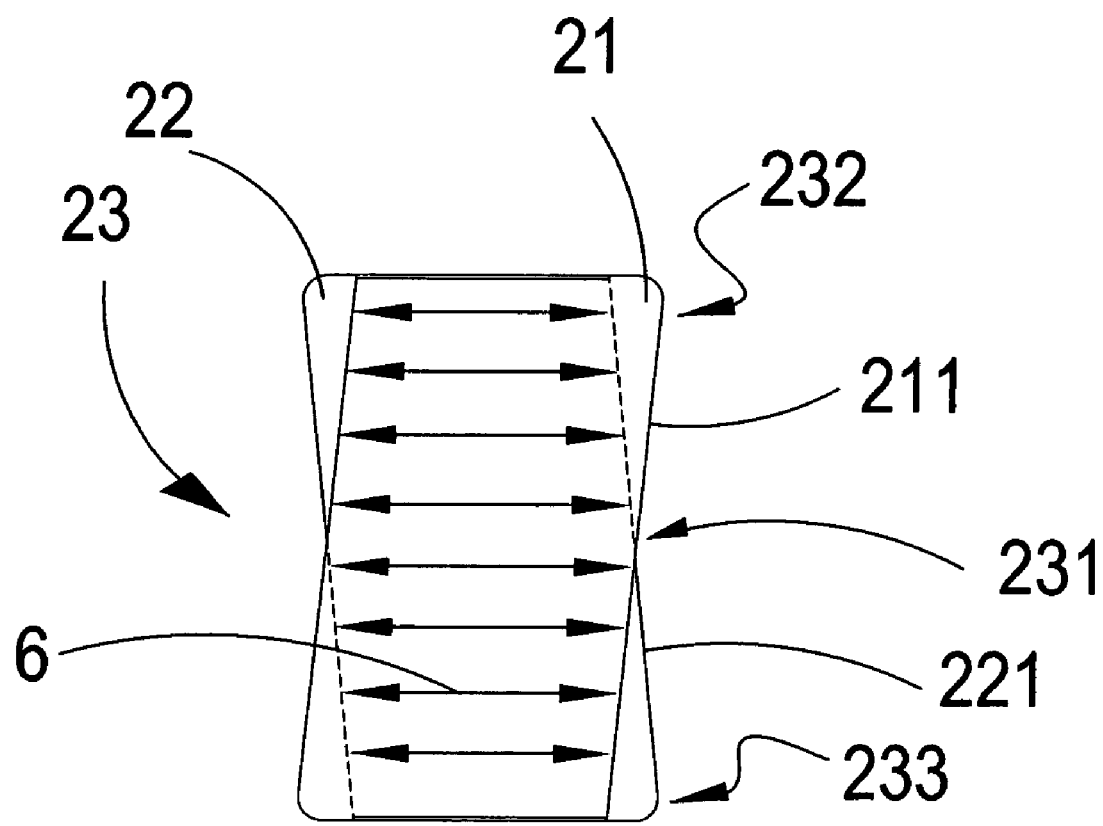
FIG. 3B is a front view of the radiating fin assembly of FIG. 3A.

Please refer to FIG. 3B, which is a front view of the radiating fin assembly of FIG. 3A. Each of the first radiating fins 21 has at least one first slant lateral edge 211, and each of the second radiating fins 22 has at least one second slant lateral edge 221 located at the same side as the first slant lateral edge 211, such that the first slant lateral edge 211 and the second slant lateral edge 221 of two adjacent first and second radiating fins 21, 22 intersect near middle points thereof. Therefore, all the intersected first and second slant lateral edges 211, 221 together define the sideward-opened substantially V-shaped recessions 23 on at least one of two longitudinal sides of the radiating fin assembly 2. In the illustrated first preferred embodiment of the present invention, the first radiating fins 21 each have two opposite but parallel first slant lateral edges 211, and the second radiating fins 22 each have two opposite but parallel second slant lateral edges 221, so that the V-shaped recessions 23 are defined on each of the two longitudinal sides of the radiating fin assembly 2.

Figure 3C:
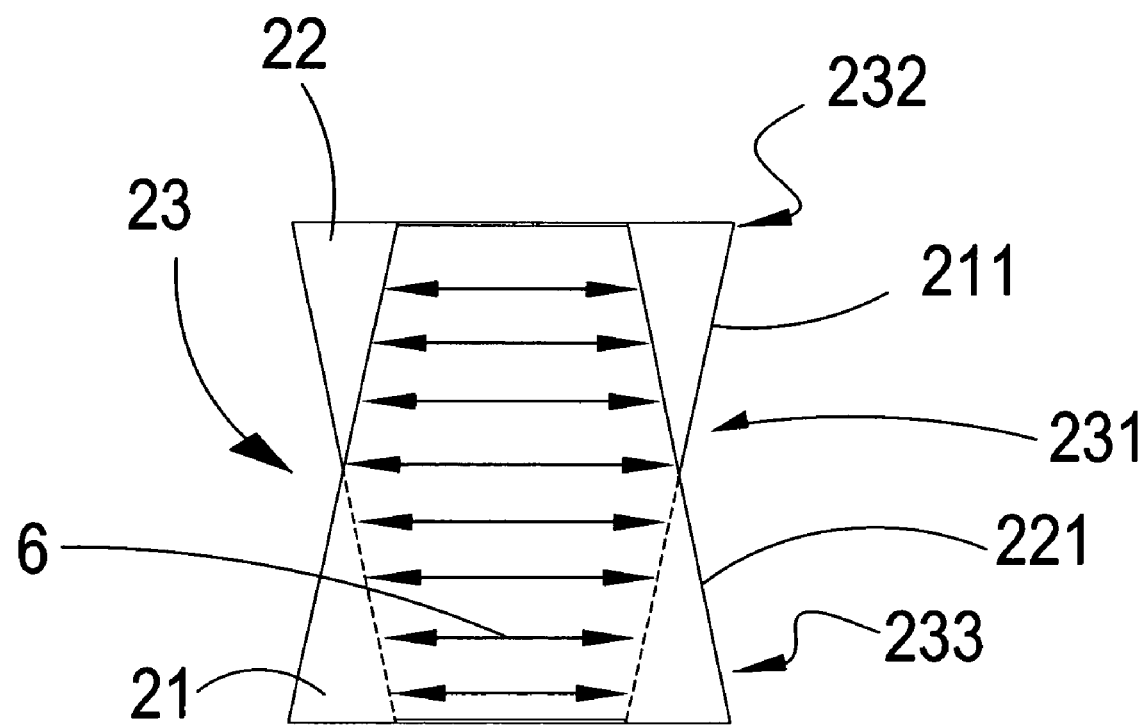
FIG. 3C is a front view of a radiating fin assembly according to a second preferred embodiment of the present invention.
Figure 4:
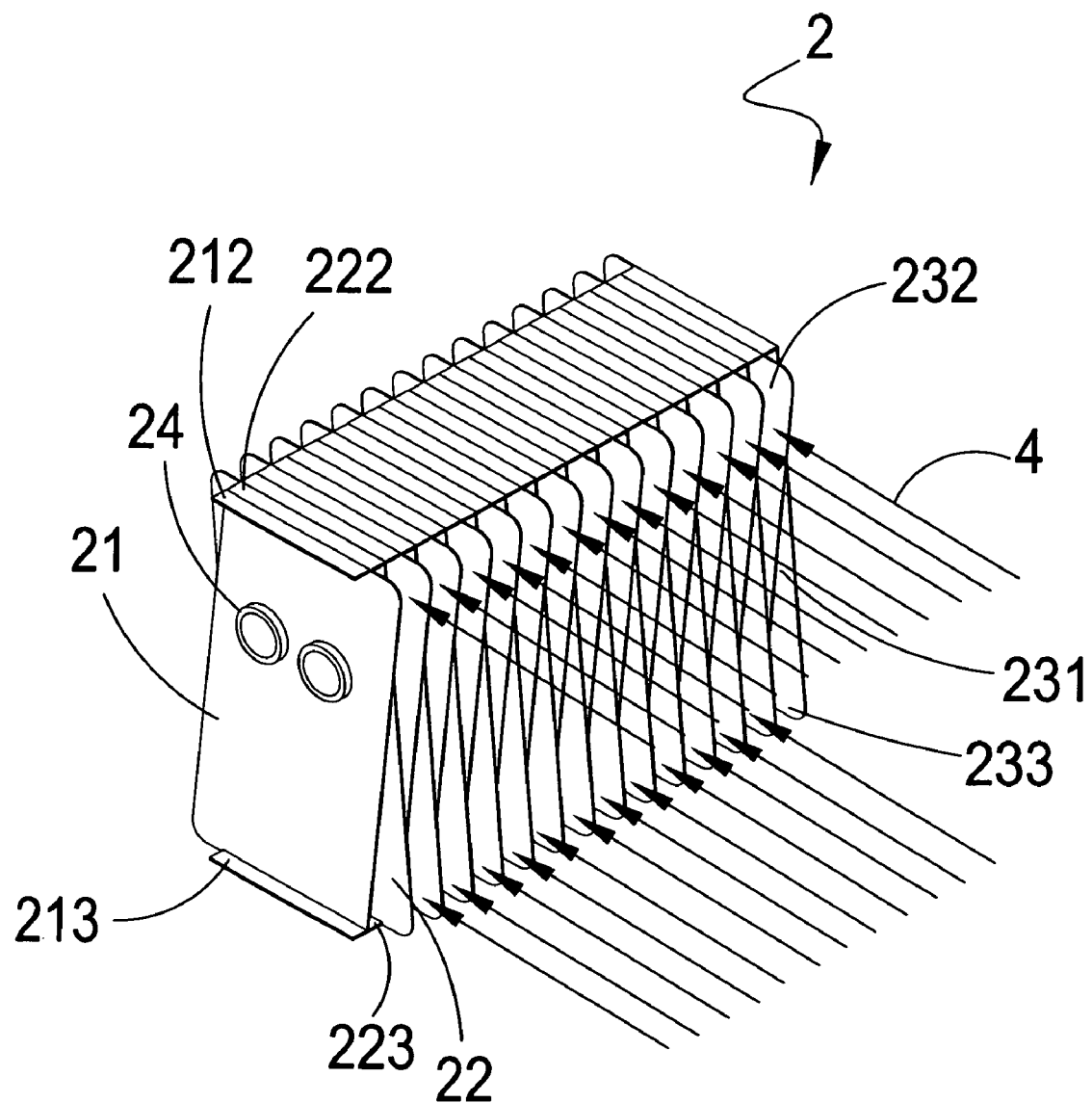
FIG. 4 is a perspective view of a radiating fin assembly according to a third preferred embodiment of the present invention.

In the first preferred embodiment as shown in FIG. 3B, the first and the second radiating fin 21, 22 are two laterally reversed parallelograms. FIG. 3C is a front view of a radiating fin assembly according to a second preferred embodiment of the present invention. In the second preferred embodiment, the first and the second radiating fin 21, 22 are two vertically reversed isosceles trapezoids. The present invention is described based on first and second radiating fins 21, 22 in the first preferred embodiment, that is, two laterally reversed parallelograms. The radiating fin assembly 2 is formed from a plurality of alternately arranged and sequentially stacked first and second radiating fins 21, 22 with sideward-opened V-shaped recessions 23 defined at two longitudinal sides of the radiating fin assembly 2. A cooling fan 7 can be arranged at one of the two longitudinal sides of the radiating fin assembly 2 to face toward the V-shaped recessions 23 defined thereat, as exemplified in FIG. 9. When the cooling fan 7 operates to produce and force cooling airflows 4 toward the V-shaped recessions 23, as shown in FIG. 4, the first and the second widened spaces 232, 233 at the V-shaped recessions 23 provide relatively large air inlets for the cooling airflows 4 to enter into the radiating fin assembly 2 with reduced pressure drop, lowered flowing resistance, and accordingly, increased flowing smoothness. With the first and second radiating fins 21, 22 having first and second slant lateral edges 211, 221, respectively, the radiating fin assembly 2 has relatively shortened airflow paths 6, as indicated in FIGS. 3B and 3C. The shortened airflow paths 6 also contribute to the reduced pressure drop, lowered flowing resistance, and increased flowing smoothness of the cooling airflows 4 flowing through the radiating fin assembly 2.

As can be seen from FIG. 4, the radiating fin assembly 2 can be provided with at least one through hole 24 for a heat pipe (not shown) to extend therethrough. Moreover, two opposite transverse edges of the first radiating fins 21 are bent toward the same side to provide a first and a second flange 212, 213; and two opposite transverse edges of the second radiating fins 22 are also bent toward the same side to provide a third and a fourth flange 222, 223 corresponding to the first and the second flange 212, 213, respectively.

Figure 5:
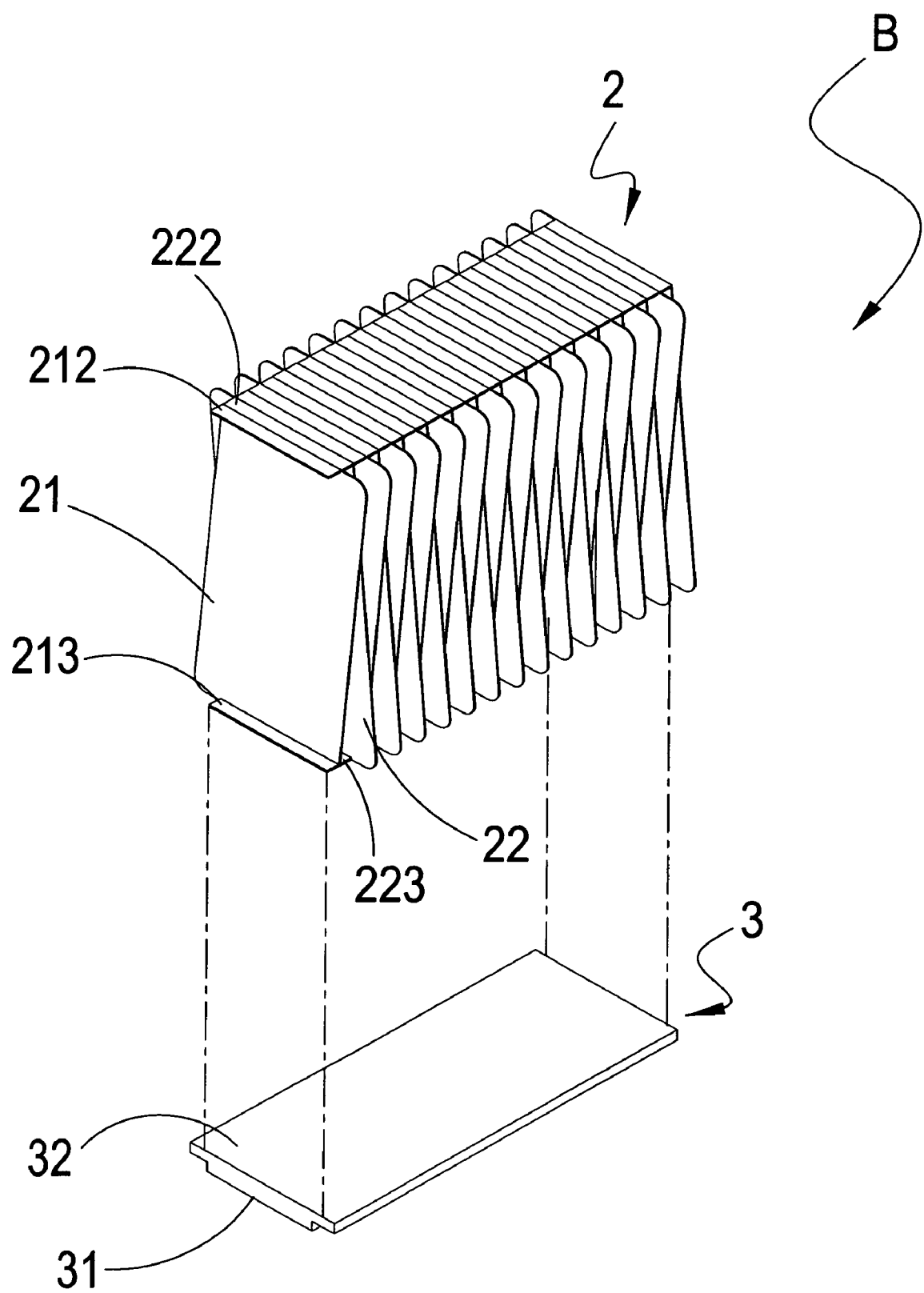
FIG. 5 is a partially exploded perspective view of a heat sink according to an embodiment of the present invention.
Figure 6:
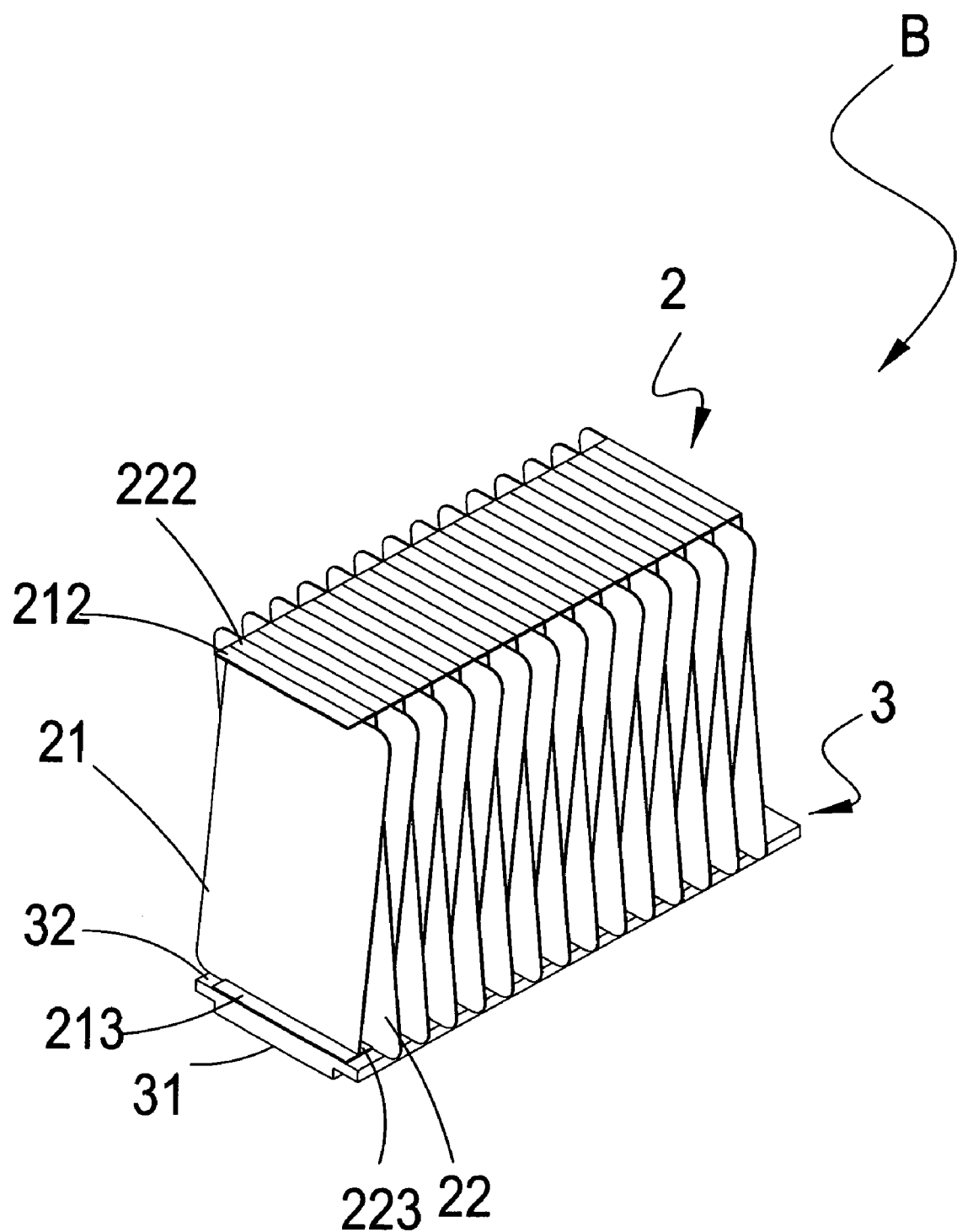
FIG. 6 is an assembled view of FIG. 5.

FIGS. 5 and 6 are partially exploded and fully assembly perspective views, respectively, of a heat sink B formed from the radiating fin assembly 2 of the present invention. More specifically, the heat sink B includes at least one radiating fin assembly 2 and a base 3. The radiating fin assembly 2 is assembled from a plurality of alternately arranged and sequentially stacked first radiating fins 21 and second radiating fins 22. The first radiating fins 21 are provided at two opposite transverse edges with first and second flanges 212, 213; and the second radiating fins-22 are provided at two opposite transverse edges with third and fourth flanges 222, 223. The base 3 includes a first face 31 for contacting with a heat-producing source (not shown) to conduct heat produced by the latter, and a second face 32 opposite to the first face 31 for selectively contacting with the first and the third flanges 212, 222 or the second and the fourth flanges 213, 223 to transfer the heat from the base 3 to the radiating fin assembly 2.

Figure 7:
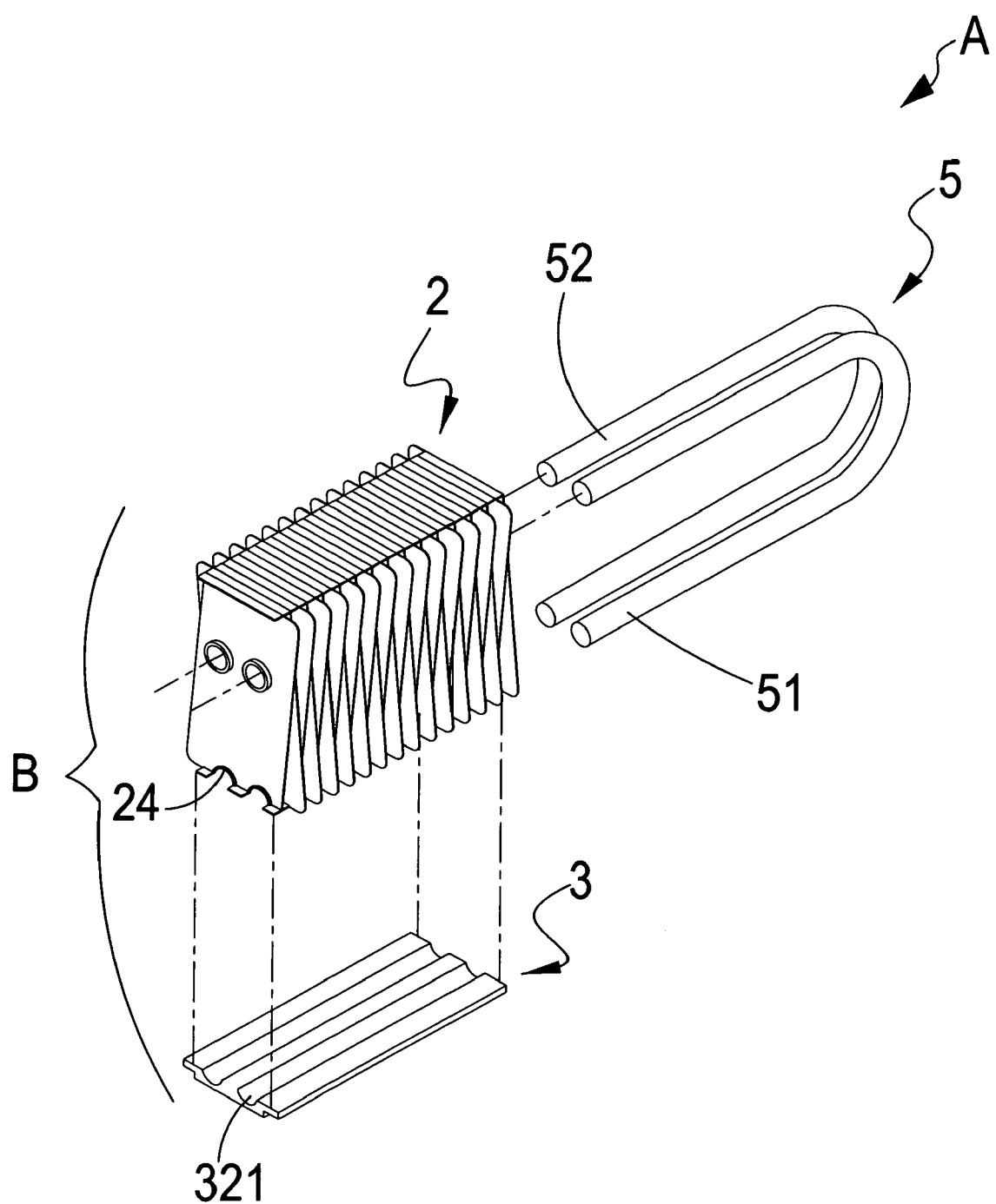
FIG. 7 is a partially exploded perspective view of a thermal module according to a first embodiment of the present invention.
Figure 8:
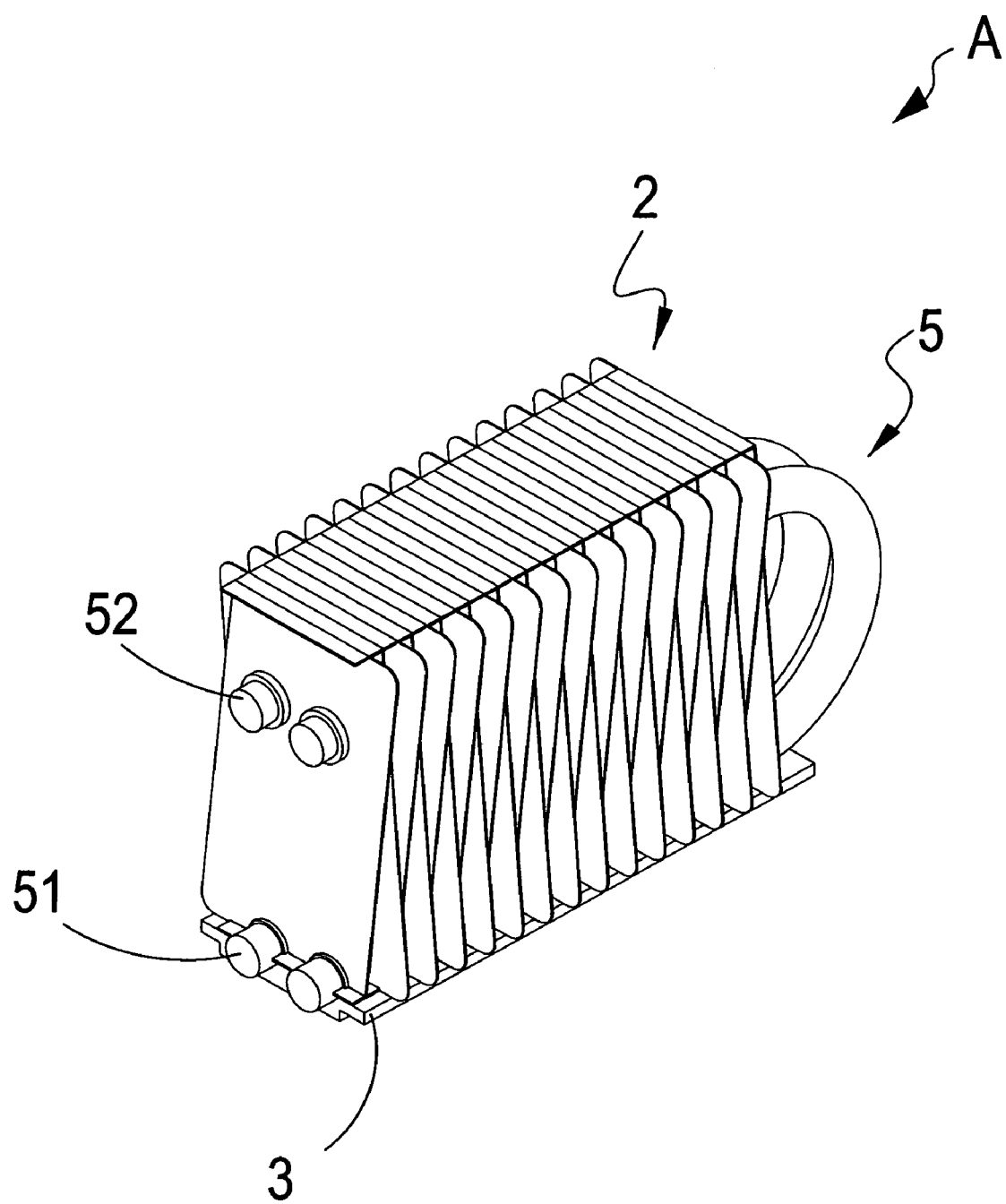
FIG. 8 is an assembled view of FIG. 7.

FIGS. 7 and 8 are partially exploded and fully assembled perspective views, respectively, of a thermal module A according to a first embodiment of the present invention. In the illustrated first embodiment, the thermal module A is formed from the heat sink B and a pair of heat pipes 5. As shown, the heat pipes 5 each have at least one heat conducting end 51 and at least one heat dissipating end 52. The heat dissipating ends of the heat pipes 5 are extended through the radiating fin assembly 2. The radiating fin assembly 2 in the illustrated first embodiment of the thermal module A is provided at the transverse edges and the flanges of the first and second radiating fins 21, 22 in contact with the second face 32 of the base 3 with two rows of notches 24. Meanwhile, the base 3 is provided on the second face 32 with two grooves 321 corresponding to the two rows of notches 24, so that the heat conducting ends 51 of the two heat pipes 5 can be received in and fixedly set between the two rows of notches 24 and the two grooves 321.

Figure 9:
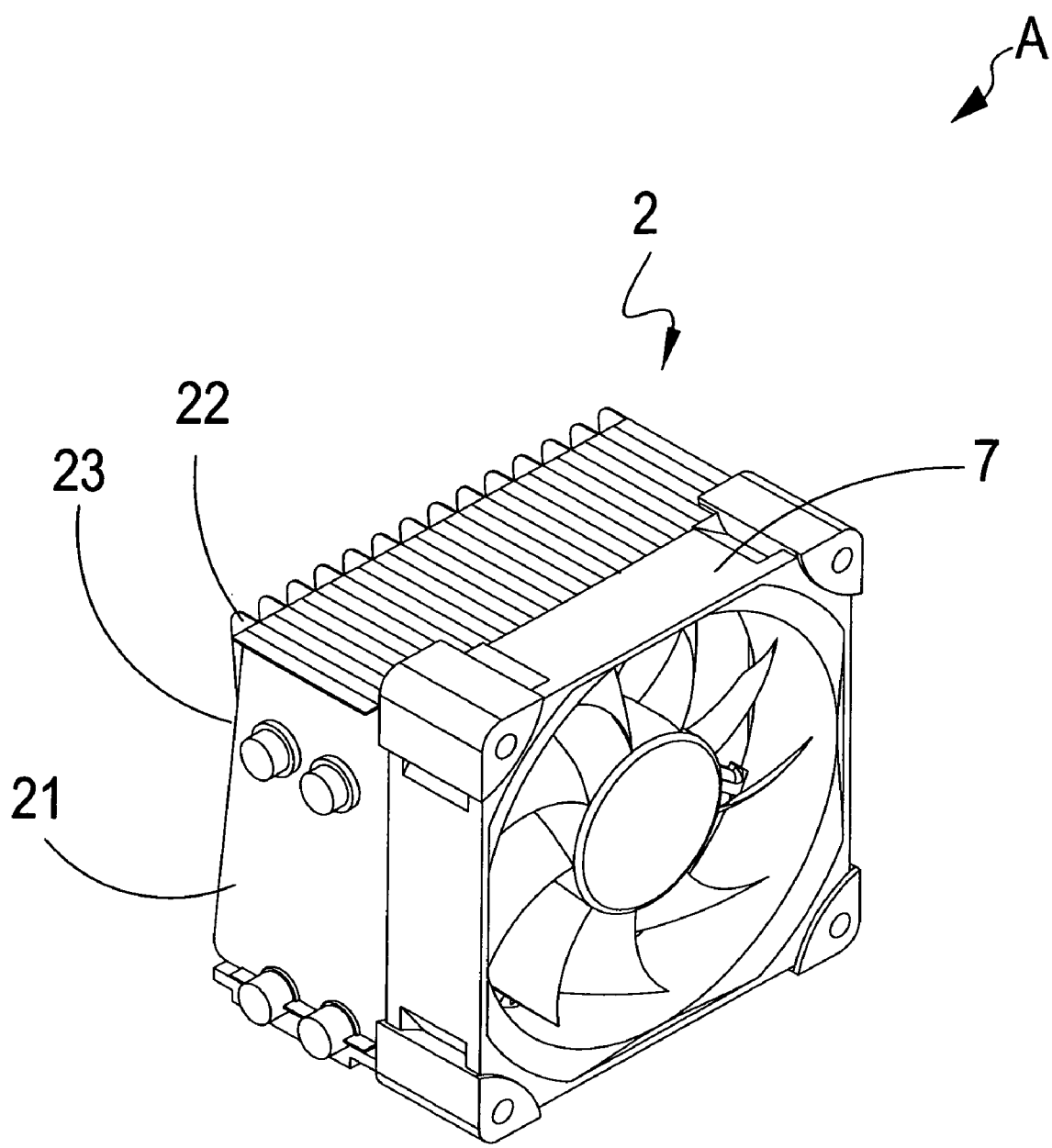
FIG. 9 is a perspective view of a thermal module according to a second embodiment of the present invention.
Figure 10:
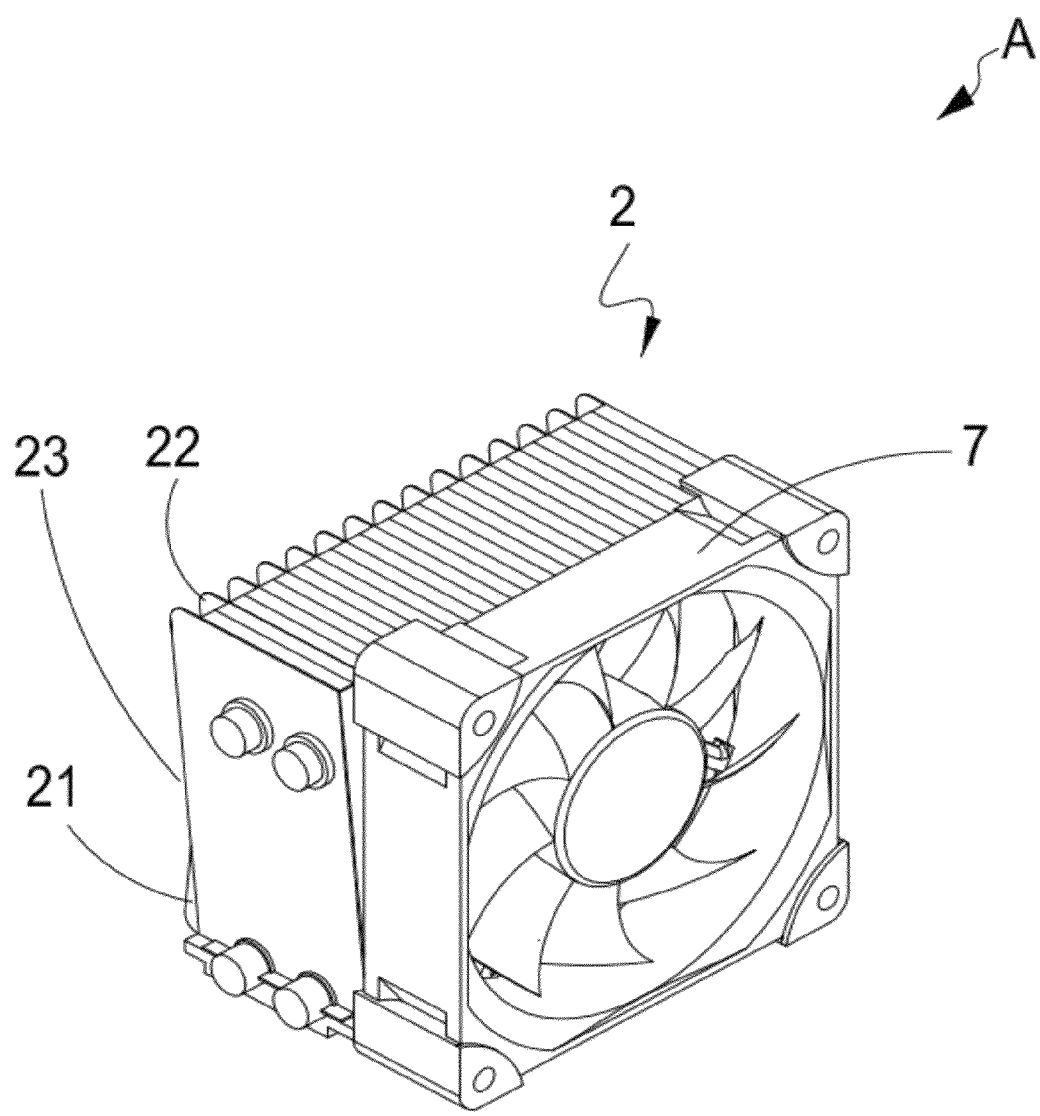
FIG. 10 is a perspective view of a thermal module according to a second embodiment of the present invention having an unequal number of first and second fins.

FIG. 9 is a perspective view of a thermal module A 5 according to a second embodiment of the present invention.

The thermal module A in the second embodiment is similar to that in the first embodiment, except for a cooling fan 7 arranged at one longitudinal side of the radiating fin assembly 2 to face toward the V-shaped recessions 23 defined thereat. When the radiating fin assembly 2 has V-shaped recessions 23 defined at two longitudinal sides thereof, the cooling fan 7 can be selectively arranged at any one of the two longitudinal sides to face toward the V-shaped recessions 23 defined thereat.

Further, in addition to alternately arranging the first and the second radiating fins 21, 22 one by one, so that the first and the second radiating fins 21, 22 are the same in number in the radiating fin assembly 2, it is also acceptable to arrange more than one first radiating fin 21 between two adjacent second radiating fins 22, or to arrange more than one second radiating fin 21 between two adjacent first radiating fins 21, so that the first and the second radiating fins 21, 22 are not the same in number.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A radiating fin assembly, comprising a plurality of alternately arranged and sequentially stacked spaced first radiating fins and second radiating fins, wherein said first and said second radiating fins are in the shape of alternating laterally reversed parallelograms such that any two adjacent first and second radiating fins together define a sideward-opened substantially V-shaped recession between them; the sideward-opened substantially V-shaped recessions being defined on each of two longitudinal sides of the radiating fin assembly, the assembly defining a plurality of split spaces, a plurality of first widened spaces, toward a first end of the first and second radiating fins and a plurality of second widened spaces toward a second end of the first and second radiating fins; the split spaces being formed at a bottom portion of the V-shaped recessions, and the first widened spaces and the second widened spaces being maximized at two opposite ends of the fins.

2. The radiating fin assembly as claimed in claim 1, wherein the first and the second widened space each have a width larger than that of the split space.

3. The radiating fin assembly as claimed in claim 1, wherein the first radiating fins each have at least one first slant lateral edge, and the second radiating fins each have at least one second slant lateral edge at the same side as the first slant lateral edge that is a reverse of the first lateral edge, such that the first slant lateral edge and the second slant lateral edge of two adjacent first and second radiating fins appear to intersect at a common point near middle points of the fins, such that all the first and second slant lateral edges together define the sideward-opened V-shaped recessions.

4. The radiating fin assembly as claimed in claim 1, further comprising at least one longitudinally extended through hole.

5. The radiating fin assembly as claimed in claim 1, wherein the first radiating fins each have two opposite transverse edges being bent in a common direction to provide a first and a second flange.

6. The radiating fin assembly as claimed in claim 1, wherein the second radiating fins each have two opposite transverse edges being bent in a common direction to provide a third and a fourth flange.

7. The radiating fin assembly as claimed in claim 1, wherein the first and the second radiating fins are alternately arranged one by one, so that the first and the second radiating fins are the same in number.

8. The radiating fin assembly as claimed in claim 1, wherein the first and the second radiating fins are alternately arranged with more than one first radiating fin arranged between any two adjacent second radiating fins or more than one second radiating fin arranged between any two adjacent first radiating fins, so that the first and the second radiating fins are not the same in number.

9. The radiating fin assembly as claimed in claim 1, further comprising a base to thereby provide a heat sink, and wherein the base has a first face in contact with a heat source and an opposite second face in contact with the first and the second radiating fins.

10. A thermal module, comprising:
   a radiating fin assembly including a plurality of alternately arranged and sequentially stacked spaced first radiating fins and second radiating fins, wherein said first and said second radiating fins are in the shape of alternating laterally reversed parallelograms such that any two adjacent first and second radiating fins together define a sideward-opened substantially V-shaped recession between them; the sideward-opened substantially V-shaped recessions being defined on each of two longitudinal sides of the radiating fin assembly, the assembly defining a plurality of split spaces, a plurality of first widened spaces, toward a first end of the first and second radiating fins and a plurality of second widened spaces toward a second end of the first and second radiating fins; the split spaces being formed at a bottom portion of the V-shaped recessions, and the first widened spaces and the second widened spaces being maximized at two opposite ends of the fins;
   a base having at least one face in contact with the radiating fin assembly; and
   a heat pipe having at least one heat conducting end in contact with the base and the radiating fin assembly, and at least one heat dissipating end extended through the radiating fin assembly.

11. The thermal module as claimed in claim 10, wherein the first and the second widened space each have a width larger than that of the split space.

12. The thermal module as claimed in claim 10, wherein the first radiating fins each have at least one first slant lateral edge, and the second radiating fins each have at least one second slant lateral edge at the same side as the first slant lateral edge, such that the first slant lateral edge and the second slant lateral edge of two adjacent first and second radiating fins appear to intersect at a common point near middle points of the fins, such that all the first and second slant lateral edges together define the sideward-opened V-shaped recessions.

13. The thermal module as claimed in claim 10, wherein the radiating fin assembly is provided with at least one longitudinally extended through hole.

14. The thermal module as claimed in claim 10, wherein the first radiating fins each have two opposite transverse edges being bent in a common direction to provide a first and a second flange.

15. The thermal module as claimed in claim 10, wherein the second radiating fins each have two opposite transverse edges being bent in a common direction to provide a third and a fourth flange.

16. The thermal module as claimed in claim 10, further comprising a cooling fan mounted to one of the two longitudinal sides of the radiating fin assembly having the sideward-opened V-shaped recessions defined thereat.

17. The thermal module as claimed in claim 10, wherein the first and the second radiating fins are alternately arranged one by one, so that the first and the second radiating fins are the same in number.

18. The thermal module as claimed in claim 10, wherein the first and the second radiating fins are alternately arranged with more than one first radiating fin being arranged between any two adjacent second radiating fins or more than one second radiating fin being arranged between any two adjacent first radiating fins, so that the first and the second radiating fins are not the same in number.

* * * * *